(12) United States Patent
Plötz et al.

(10) Patent No.: US 8,593,390 B2
(45) Date of Patent: Nov. 26, 2013

(54) ILLUMINATION DEVICE

(75) Inventors: Ludwig Plötz, Amschwang (DE);
Markus Zeiler, Nittendorf (DE);
Michael Sailer, Wolfskofen (DE);
Kurt-Jürgen Lang, Regen (DE);
Robert Kraus, Regensburg (DE);
Harald Stoyan, Regensburg (DE)

(73) Assignee: OSRAM Gesellschaft mit beschrankter Haftung, Munich (DE)

( * ) Notice: Subject to any disclaimer, the term of this patent is extended or adjusted under 35 U.S.C. 154(b) by 498 days.

(21) Appl. No.: 12/086,741

(22) PCT Filed: Dec. 15, 2006

(86) PCT No.: PCT/DE2006/002267
§ 371 (c)(1),
(2), (4) Date: May 17, 2010

(87) PCT Pub. No.: WO2007/076819
PCT Pub. Date: Jul. 12, 2007

(65) Prior Publication Data
US 2010/0220046 A1     Sep. 2, 2010

(30) Foreign Application Priority Data

Dec. 16, 2005  (DE) .......................... 10 2005 060 383
Jul. 21, 2006  (DE) .......................... 10 2006 033 894

(51) Int. Cl.
*G09G 3/36* (2006.01)

(52) U.S. Cl.
USPC ........................................... 345/102; 257/98

(58) Field of Classification Search
USPC ........... 345/102; 313/500, 506; 362/231, 252, 362/373, 800; 257/98–100
See application file for complete search history.

(56) References Cited

U.S. PATENT DOCUMENTS

| | | | |
|---|---|---|---|
| 4,907,044 A | 3/1990 | Schellhorn et al. | |
| 6,111,272 A | 8/2000 | Heinen | |
| 6,556,268 B1 | 4/2003 | Lee et al. | |
| 6,857,767 B2 | 2/2005 | Matsui et al. | |
| 7,585,083 B2 * | 9/2009 | Kim et al. | 362/97.3 |
| 7,696,441 B2 * | 4/2010 | Kataoka | 174/254 |
| 7,713,092 B2 * | 5/2010 | Kim et al. | 439/660 |
| 7,804,478 B2 * | 9/2010 | Schou | 345/102 |
| 7,855,708 B2 * | 12/2010 | Ruby et al. | 345/102 |
| 2002/0017652 A1 * | 2/2002 | Illek et al. | 257/95 |
| 2002/0071288 A1 | 6/2002 | Lim | |
| 2003/0067577 A1 * | 4/2003 | Yamada | 349/150 |
| 2004/0212982 A1 | 10/2004 | Chang | |
| 2005/0001537 A1 | 1/2005 | West et al. | |
| 2005/0073495 A1 | 4/2005 | Harbers et al. | |

(Continued)

FOREIGN PATENT DOCUMENTS

| | | |
|---|---|---|
| DE | 10 2004 047 669 | 4/2006 |
| EP | 0 905 797 | 8/1998 |

(Continued)

*Primary Examiner* — Dmitriy Bolotin
(74) *Attorney, Agent, or Firm* — Cozen O'Connor

(57) ABSTRACT

An illumination device comprises at least one light module (1) wherein the light module (1) comprises a circuit board (2) to which a plurality of groups (30) of light sources (3a, 3b, 3c) are applied and a carrier (6) on which the light module (1) is fixed. A display apparatus comprising such an illumination device is also disclosed.

17 Claims, 6 Drawing Sheets

(56) References Cited

U.S. PATENT DOCUMENTS

| | | |
|---|---|---|
| 2005/0218421 A1 | 10/2005 | Andrews et al. |
| 2005/0243576 A1 | 11/2005 | Park et al. |
| 2005/0259195 A1 | 11/2005 | Koganezawa |
| 2006/0066265 A1 | 3/2006 | Plotz et al. |
| 2006/0120077 A1* | 6/2006 | Yoon et al. .................... 362/231 |
| 2012/0320566 A1* | 12/2012 | Namekata .................... 362/97.3 |

FOREIGN PATENT DOCUMENTS

| | | |
|---|---|---|
| KR | 102004008 6659 | 10/2004 |
| WO | WO 02/13281 | 2/2002 |
| WO | WO 03/021565 | 3/2003 |
| WO | WO 2004/031844 | 4/2004 |
| WO | WO 2005/114273 | 12/2005 |
| WO | WO 2006/076899 | 7/2006 |

* cited by examiner

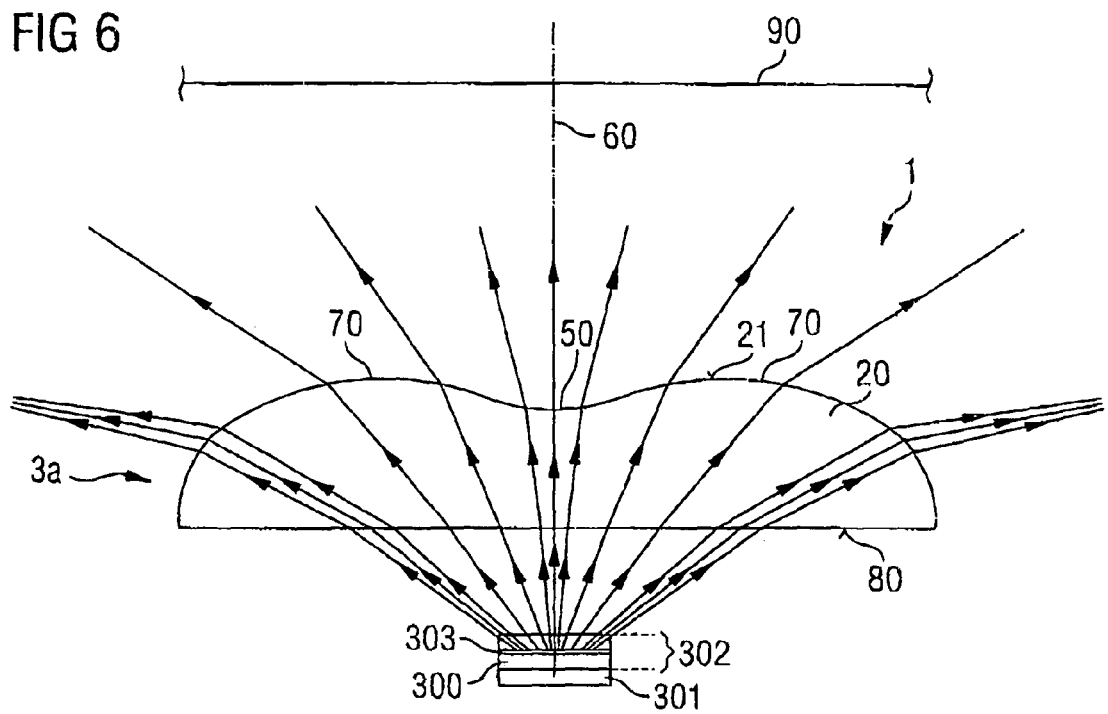
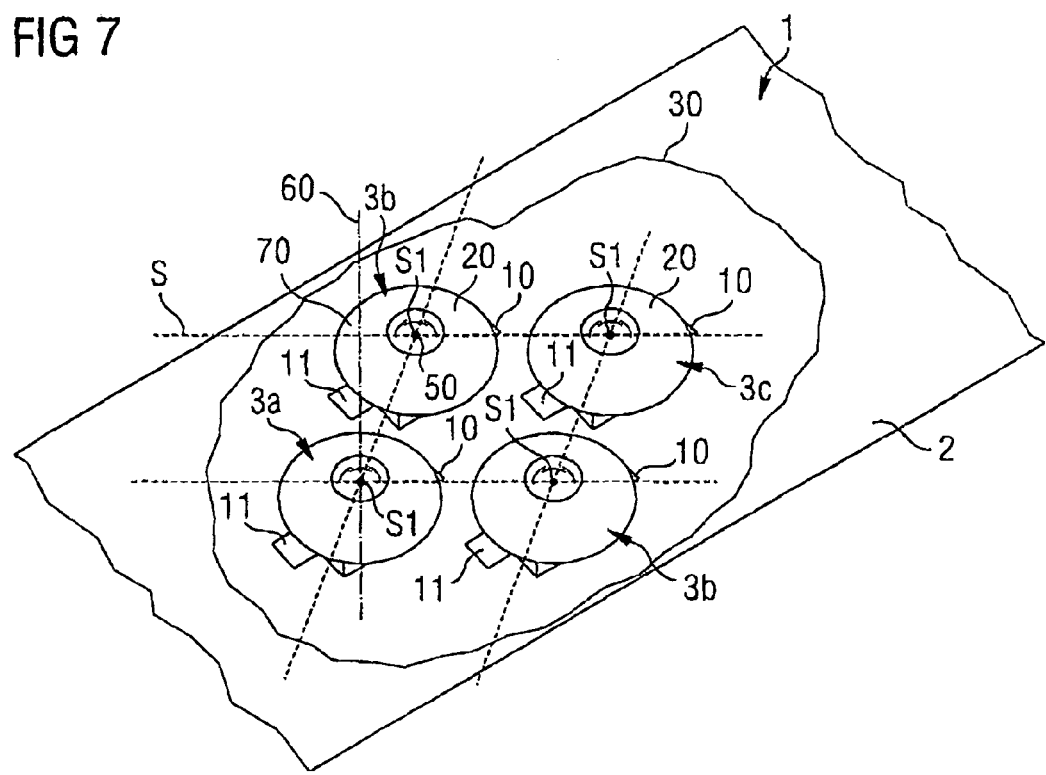

ILLUMINATION DEVICE

RELATED APPLICATIONS

This is a U.S. national stage under 35 USC 371 of application No. PCT/DE2006/002267, filed on 15 Dec. 2006.

This application claims the priority of German applications no. 10 2005 060 383.1 filed Dec. 16, 2005 and no. 10 2006 033 894.4 filed Jul. 21, 2006, the entire content of both of which is hereby incorporated by reference.

The present invention is related to an illumination device and to a display apparatus comprising such an illumination device.

BACKGROUND OF THE INVENTION

The document WO2004/031844A1 describes an illumination device.

SUMMARY OF THE INVENTION

One object of the present invention is to provide an illumination device which can be produced particularly cost-effectively and simply.

This and other objects are attained in accordance with one aspect of the present invention directed to an illumination device comprising at least one light module wherein the light module comprises a circuit board to which a plurality of groups of light sources are applied and a carrier on which the light module is fixed.

In accordance with at least one embodiment of the illumination device, the illumination device comprises at least one light module. The light module comprises a circuit board and also a plurality of groups of light sources applied to the circuit board. The circuit board forms a connection carrier for the light sources. The circuit board can comprise for example a basic body which is formed in electrically insulating fashion and on which are formed conductor tracks consisting of an electrically conductive material. Electrical contact is made with the light sources of the light module via the conductor tracks of the circuit board.

Each group of light sources of the light module comprises at least one light source, preferably, at least two light sources, particularly preferably at least three light sources.

Preferably, the light module comprises at least two groups of light sources which are formed identically in type. These groups then comprise the same number of light sources of identical type. The light sources of the groups formed identically in type are in each case arranged in the same way with respect to one another. That is to say that the light sources of two groups formed identically in type are arranged for example at the grid points of the same regular grid.

In accordance with at least one embodiment of the illumination device, the at least one light module of the illumination device is mechanically fixed onto a carrier of the illumination device. Preferably, a multiplicity of light modules formed identically in type are fixed on the carrier.

In accordance with at least one embodiment of the illumination device, the illumination device comprises a light module. The light module comprises a plurality of groups of light sources applied to a circuit board of the light module. The light module is fixed on a carrier of the illumination device.

The illumination device described here makes use of the concept, inter alia, that a modular construction of the illumination device, that is to say dividing the illumination device into individual light modules which are in each case formed identically or identically in type, enables the illumination device to be produced particularly cost-effectively and simply.

In accordance with at least one embodiment of the illumination device, at least one light module of the illumination device is formed in strip-type fashion. Preferably, all the light modules of the illumination device are formed in strip-type fashion. In strip-type fashion means that the length of the light module is greater than the width of the light module. In strip-type fashion can furthermore mean that a multiplicity of groups of light sources are arranged in a main extension direction of the light module—for example horizontally—alongside one another on the circuit board of the light module.

In accordance with at least one embodiment, the light modules of the illumination device are arranged in lines on the carrier of the illumination device. Arranged in lines means that each light module forms at least one line of the illumination device. In the line of the illumination device, groups of light sources of the associated light module are arranged alongside one another in a horizontal direction. In a vertical direction, the light module is then followed by a further light module that forms a further line of the illumination device.

In accordance with at least one embodiment, at least one light source of the light module comprises a light emitting diode. Preferably, all the light sources of the illumination device are formed in each case by a light emitting diode. The light emitting diode preferably comprises a carrier and/or a housing, at least one light emitting diode chip and also an optical element disposed downstream of the light emitting diode chip in the emission direction thereof. In this case, "disposed downstream" means that a large part of the electromagnetic radiation emitted by the light emitting diode chip passes through the optical element of the light emitting diode and is optically manipulated by the optical element.

In accordance with at least one embodiment of the illumination device, at least one light emitting diode of the illumination device comprises a light emitting diode chip provided for generating radiation and an optical element which has an optical axis, wherein the optical element has a radiation exit area, and the radiation exit area has a concavely curved partial region and a convexly curved partial region, which at least partly surrounds the concavely curved partial region at a distance from the optical axis, wherein the optical axis runs through the concavely curved partial region.

Such a shaping of the radiation exit area of the optical element facilitates the alteration of the emission characteristic of the light emitting diode, such that the radiation power coupled out from the light emitting diode at an angle of greater than zero with respect to the optical axis is increased in comparison with the emission characteristic of the light emitting diode without an optical element. In particular the convexly curved partial region contributes to this, said region increasing the proportion of radiation coupled out from the light emitting diode at large angles with respect to the optical axis. The light emitting diode having an optical element of this type is accordingly particularly well suited to the homogeneous illumination of a comparatively large, in particular planar. This is in particular true in area regions that are laterally offset with respect to the optical axis.

In accordance with at least one embodiment of the illumination device, the optical axis of the optical element runs through the light emitting diode chip of the light emitting diode. The light emitting diode chip can be arranged in centered fashion in particular with respect to the optical axis. That is to say, for example, that the optical axis runs through the geometrical center of a radiation exit area of the light emitting diode chip. Preferably, the optical axis of the optical element is then perpendicular to the radiation exit area and/or a layer of the active zone of the light emitting diode chip. Such an arrangement of the light emitting diode chip relative to the optical element facilitates a homogeneous beam shaping of the electromagnetic radiation generated by the light emitting diode chip by means of the optical element. Preferably, the optical element is embodied rotationally symmetrically with respect to the optical axis. This advantageously results in an emission characteristic of the illumination device which is uniform and homogeneous azimuthally with respect to the optical axis.

In accordance with at least one embodiment of the illumination device, the light emitting diode chip of at least one light source is formed as a thin-film light emitting diode chip. Preferably, all the light emitting diode chips of the illumination device are embodied as thin-film light emitting diode chips. That is to say that the light emitting diode chips comprise an epitaxially grown layer sequence in which a growth substrate is either thinned or completely removed. The epitaxially grown layers are then applied with their surface remote from the original growth substrate on a carrier or directly onto the circuit board of the light module. Optoelectronic semiconductor chips of thin-film design are described for example in the documents WO 02/13281 or EP 0905797, the disclosure content of which with regard to the thin-film design of optoelectronic semiconductor chips is hereby expressly incorporated by reference.

In accordance with at least one embodiment of the illumination device, the circuit board of the at least one light module is embodied as a flexible circuit board. Preferably, the circuit boards of all the light modules of the illumination device are embodied as flexible circuit boards. The flexible circuit board comprises a flexible basic body which consists of a flexible, electrically insulating material such as PI, PEN, or PE or contains at least one of said materials. Electrical conductor tracks are structured on the basic body. The flexible circuit board can be embodied for example as a flexible printed circuit board (printed flex board). Preferably, the circuit board is embodied flexibly in such a way that it can be rolled up. That is to say that the circuit board can be populated with the light sources in a "reel-to-reel" process so that the populated circuit board can then preferably also be rolled up again. This permits particularly simple production and handling of the light module.

In accordance with at least one embodiment of the illumination device, the circuit board of the at least one light module is embodied as a flexible circuit board. Preferably, the circuit boards of all the light modules of the illumination device are embodied as flexible circuit boards. The flexible circuit board comprises a flexible basic body which consists of a flexible, electrically insulating material such as PI, PEN, or PE or contains at least one of said materials. Electrical conductor tracks are structured on the basic body. The flexible circuit board can be embodied for example as a flexible printed circuit board (printed flex board). Preferably, the circuit board is embodied flexibly in such a way that it can be rolled up. That is to say that the circuit board can be populated with the light sources in a "reel-to-reel" process so that the populated circuit board can then preferably also be rolled up again. This permits particularly simple production and handling of the light module.

In accordance with at least one embodiment of the illumination device, at least one light module of the illumination device has at least one fold. Preferably, the light module then has at least two folds. That is to say that the circuit board of a light module is folded at least two locations of the circuit board. Preferably, the locations of the circuit board which have a fold are not populated with groups of light sources.

A U-shaped bend of the circuit board is produced for example by means of two successive folds. With the aid of the folds and the bend of the light module that is produced by the fold, a strip-type light module whose length is greater than its width can be fixed in at least two lines on the carrier. The two lines of the light module are then connected to one another by the bend, which is arranged for example in the vicinity of the edge of the carrier of the illumination device.

In accordance with at least one embodiment, at least one circuit board of a light module of the illumination device has an incision. The incision extends preferably over at least 50%, particularly preferably over at least 70%, of the length of the circuit board of the light module. In this case, the incision is embodied in such a way that it does not completely sever the circuit board of the light module, rather a part of the circuit board remains which has no incision. Preferably, the circuit board of the light module has a plurality of such incisions running parallel to one another. In this case, the incisions are preferably made in the circuit board from alternate sides of the circuit board of the light module. That is to say that the circuit board has for example a first incision made in the circuit board in a manner coming from the right. Running parallel to this there is then a second incision made in the circuit board in a manner coming from the left. A third incision into the circuit board can then be made in a manner coming from the right in accordance with the first incision.

In this case, "incision" means that the circuit board is severed or has a perforation over a specific length—the length of the incision—along the main extension direction of the circuit board.

In accordance with at least one embodiment of the illumination device, the light module is expanded in a direction running transversely with respect to the incision. A direction transversely with respect to the incision denotes for example a direction which runs in the plane spanned by the circuit board of the light module and runs perpendicular to the main extension direction of the incision. Expanded means that the circuit board of the light module is pulled apart in this direction. The circuit board of the light module is pulled apart in this direction for example in the manner of an accordion. If a plurality of groups of light sources are arranged in lines on the circuit board of the light module, then the at least one incision preferably runs between two lines of groups of light sources. The distance between the lines can then be set by the expansion of the circuit board.

In accordance with at least one embodiment of the illumination device, at least one light module of the illumination device comprises a control device. Preferably, each light module of the illumination device comprises a control device. Particularly preferably, a control device is assigned one to one to each light module of the illumination device. The control device comprises a microcontroller, for example. In this case, the control device is suitable for setting an operating current through the light sources of the light module. That is to say that the operating current through the light sources of the light module is set by the control device. In this case, the control devices of individual light modules can also be electrically interconnected. As a result of the interconnection of the control devices, it is possible for example to transfer a control signal for the entire illumination device to the individual light modules.

In accordance with at least one embodiment of the illumination device, the control device is suitable for regulating the operating current through the assigned light module depending on at least one measured value. For this purpose, the illumination device can comprise at least one sensor which is provided for example for determining the intensity and/or the color locus of the electromagnetic radiation emitted by the light sources of the light module. The sensor forwards the measured value determined in this way to the control device. For this purpose, the sensor is connected to the control device of the light module preferably via conductor tracks of the circuit board of the light module. The control device regulates the operating current through the light sources of the light module depending on the measured value. That is to say that the operating current through the light sources is altered depending on the measured value, whereby the measured value determined by the sensor in a next time step is in turn altered.

An arrangement and also a method for regulating a light module are described for example in the document DE 102004047669, the disclosure content of which with regard to the regulation of a light module is hereby expressly incorporated by reference.

In accordance with at least one embodiment of the illumination device, the control device is arranged on the carrier of the illumination device and mechanically fixed on the carrier. The control device is preferably arranged on that side of the carrier which is remote from the light sources of the light module. In this way, the control device is integrated into the illumination device in a particularly space-saving manner.

In accordance with at least one embodiment of the illumination device, at least one heat conducting element is applied to that side of the circuit board of a light module which is remote from the light sources of the light module. The heat conducting element is formed for example by a rigid carrier forming a rigid support for the flexible circuit board of the light module. Preferably, the heat conducting element contains a material that conducts heat well, such as copper and/or aluminum.

Another aspect of the invention is directed to a display apparatus. In accordance with at least one embodiment, the display apparatus comprises an imaging unit. The imaging unit is embodied for example as an LCD panel (LCD-liquid crystal display). The imaging unit has an area which is backlit by an illumination device as described in at least one of the embodiments. In this case, the imaging unit is preferably backlit directly by the illumination device. That is to say that the imaging unit is disposed downstream of the illumination device in an emission direction of the light sources of the illumination device. In this case, "disposed downstream" means that at least a large part of the electromagnetic radiation emitted by the light sources impinges on the imaging unit. Preferably, the imaging unit is arranged parallel to the carrier of the illumination device.

BRIEF DESCRIPTION OF THE DRAWINGS

The illumination device described here is explained in more detail below on the basis of exemplary embodiments and the associated figures.

FIG. 6 shows a schematic sectional illustration of a light emitting diode 3a such as is used in a light module 1 of the illumination device.

FIG. 7 shows a schematic perspective illustration of a portion from a light module 1 such as can be used in one of the exemplary embodiments of the illumination device as described further above.

DETAILED DESCRIPTION OF THE DRAWINGS

In the exemplary embodiments and figures, identical or identically acting component parts are in each case provided with the same reference symbols. The elements illustrated should not be regarded as true to scale; rather, individual elements may be illustrated with an exaggerated size in order to afford a better understanding.

Figure 1A:
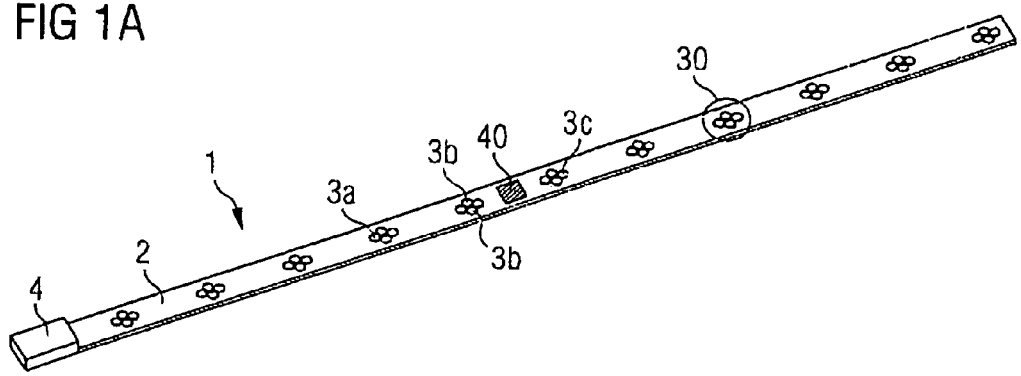
FIG. 1A shows a schematic perspective illustration of a light module 1 for a first exemplary embodiment of an illumination device described here.

FIG. 1A shows a schematic perspective illustration of a light module 1 for a first exemplary embodiment of an illumination device described here.

The light module 1 comprises a circuit board 2. The circuit board 2 is a flexible circuit board. The circuit board 2 comprises a basic body formed from an electrically insulating material. By way of example, the basic body contains or consists of one of the following materials: PI, PEN, PE. Electrical conductor tracks are structured on the electrically insulating basic body. By way of example, the conductor tracks are printed onto the electrically insulating basic body. The circuit board 2 is then a printed flexible circuit board.

A plurality of light emitting diodes 3a, 3b, 3c are applied to the circuit board 2 as light sources of the light module 1. Electrical contact is made with the light emitting diodes 3a, 3b, 3c by means of the conductor tracks of the circuit board. The light emitting diodes 3a, 3b, 3c are combined to form groups 30 of light sources. In the exemplary embodiment described in conjunction with FIG. 1A, each group 30 comprises one blue light emitting diode 3a, two green light emitting diodes 3b and one red light emitting diode 3c.

The light module 1 furthermore comprises a control device 4. The control device 4 is suitable for driving the light emitting diodes 3a, 3b, 3c of the light module 1 and for energizing them with a predeterminable operating current.

The control device 4 is furthermore preferably suitable for regulating the current through the light emitting diodes 3a, 3b, 3c of the light module 1 depending on measured values such as the brightness and the color locus of the light emitted by the light emitting diodes 3a, 3b, 3c during operation of the illumination device. For this purpose, a sensor 40—for example a photodiode—can be arranged on the circuit board 2 of the light module 1. The sensor 40 is electrically conductively connected to the control device 4 by means of conductor tracks of the circuit board 2. The control device 4 integrated with the light module 1 enables an optimized light control of the light emitting diodes 3a, 3b, 3c of the light module.

Figure 1B:
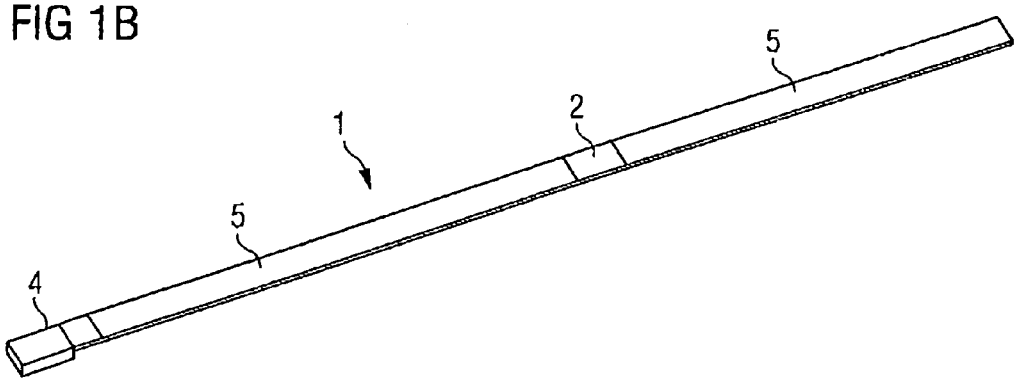
FIG. 1B shows, in a schematic perspective illustration, the rear side of the light module described in conjunction with FIG. 1A.

FIG. 1B shows, in a schematic perspective illustration, the rear side—remote from the light emitting diodes 3a, 3b, 3c—of the light module 1 as was described in conjunction with FIG. 1A.

As is shown in FIG. 1B, a heat conducting element 5 is applied to the rear side of the circuit board 2. The heat conducting element 5 contains or consists of a material that conducts heat well, such as copper or aluminum. In this case, the heat conducting element 5 simultaneously forms a rigid support for the flexible circuit board 2. In this case, it is possible—as shown in FIG. 1B—for the heat conducting element 5 to be applied in portions to the rear side of the circuit board 2, such that the circuit board 2 has regions that are not covered by the heat conducting element 5. These uncovered regions are then still flexible. The light module 1 can be bent or folded, for example, at said regions.

The circuit board 2 already populated with the light emitting diodes 3a, 3b, 3c can be processed for example in a "from-reel-to-reel" process.

Figure 2A:
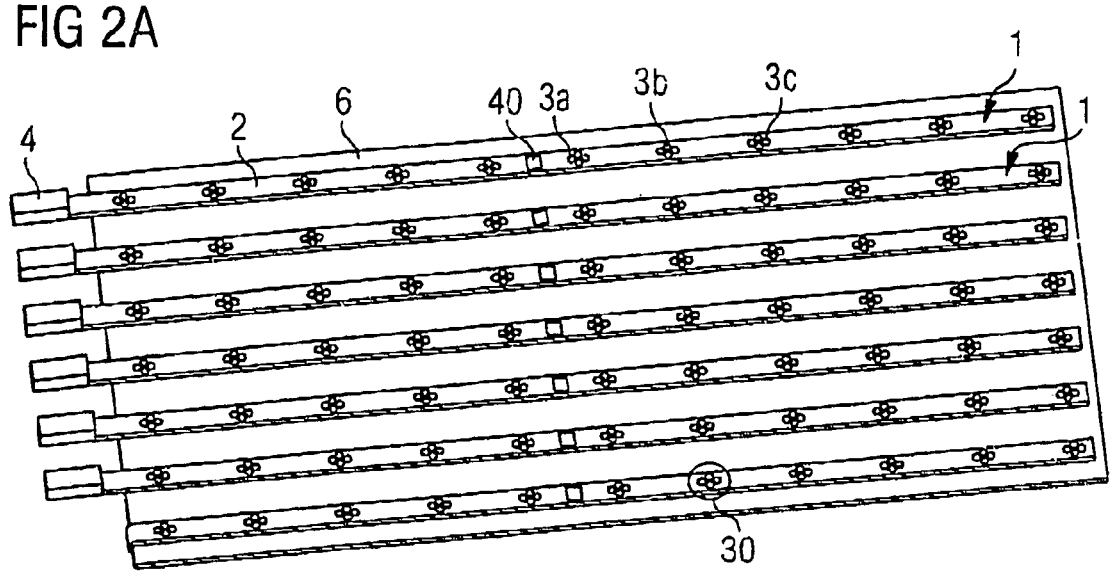
FIG. 2A shows a schematic perspective illustration of an illumination device described here in accordance with the first exemplary embodiment.
Figure 2B:
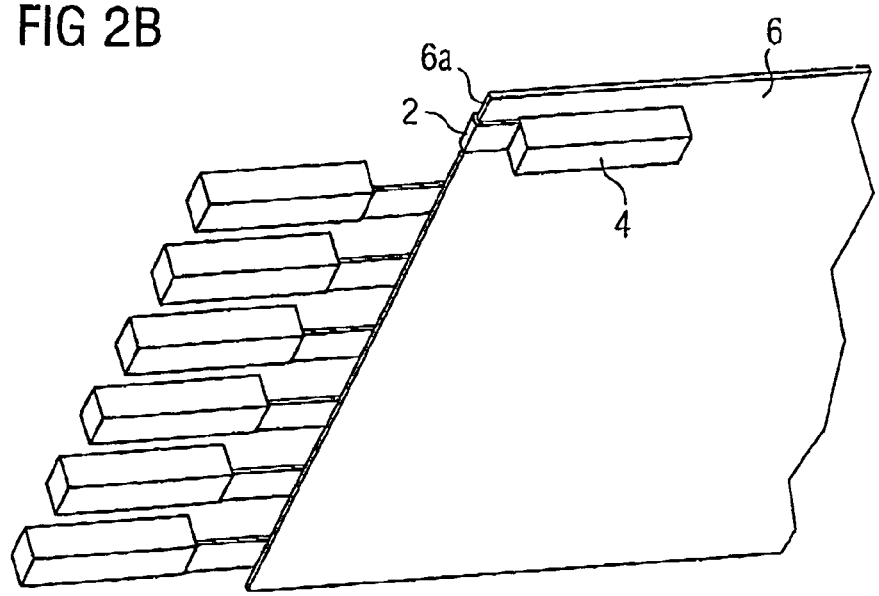
FIG. 2B shows, in a schematic perspective illustration, the associated rear view of the illumination device in accordance with the first exemplary embodiment.

FIG. 2A shows a schematic perspective illustration of an illumination device described here in accordance with the first exemplary embodiment. FIG. 2B shows, in a schematic perspective illustration, the associated rear view of the illumination device in accordance with the first exemplary embodiment.

A plurality of the light modules 1 as described in conjunction with FIGS. 1A and 1B are applied to a carrier 6 of the illumination device. The carrier 6 is for example a backplane of the illumination device. The carrier 6 is preferably formed from a metal or a plastic that conducts heat well. By way of example, the carrier 6 is a metal sheet.

In the exemplary embodiment of the illumination device as described in conjunction with FIGS. 2A and 2B, the light modules 1 are arranged in lines on the carrier 6. The light modules 1 are fixed on the carrier 6 for example by means of screwing, caulking, snap-action fastening, adhesive bonding or some other fixing method.

As is illustrated in FIG. 2B, the flexible circuit board is bent around the edge 6a of the carrier 6. In this way, the control device 4 can be fixed on the rear side of the carrier 6 remote from the light emitting diodes 3a, 3b, 3c. This enables a particularly compact illumination device.

Figure 3A:
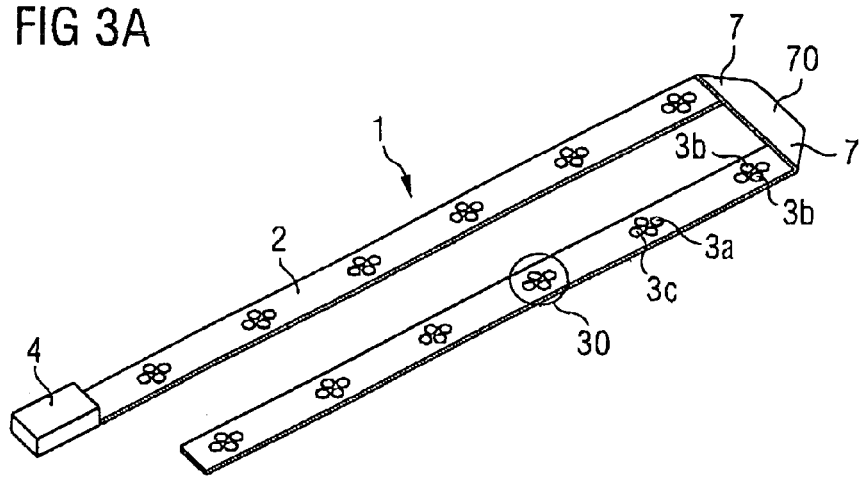
FIG. 3A shows a schematic perspective illustration of a light module 1 for a second exemplary embodiment of an illumination device described here.

FIG. 3A shows a schematic perspective illustration of a light module 1 for a second exemplary embodiment of an illumination device described here.

In this exemplary embodiment, the circuit board 2 has two folds 7. A U-shaped bend 70 of the circuit board 2 is produced by the folds 7. In this way, the groups 30 of light emitting diodes 3a, 3b, 3c of the light module 1 can be arranged in two lines that run substantially parallel to one another or run parallel to one another. Furthermore, it is possible for the circuit board 2 to have further U-shaped bends 70, such that the groups of the light module 1 are arranged in three or more lines.

Figure 3B:
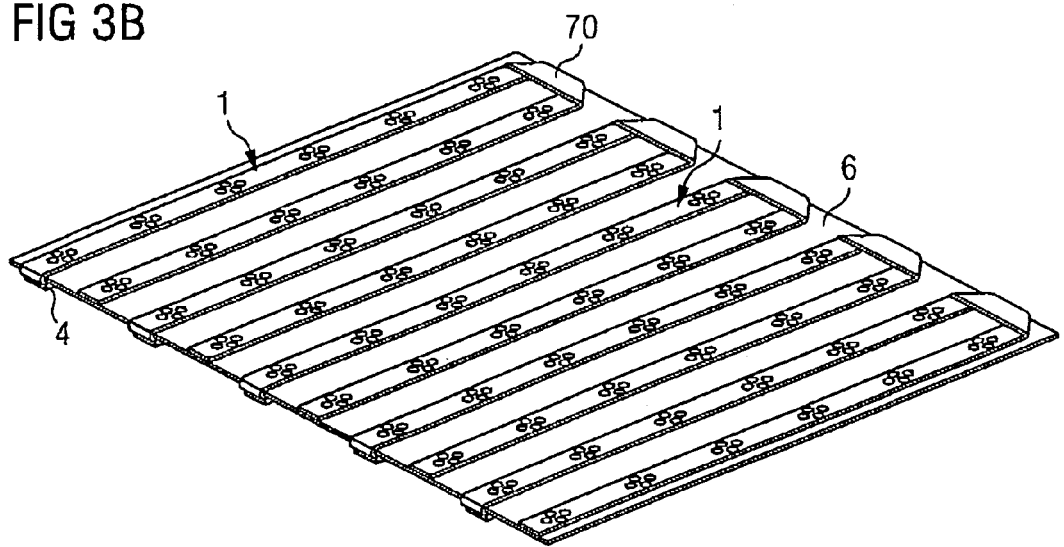
FIG. 3B shows a schematic perspective illustration of the second exemplary embodiment of an illumination device described here.

FIG. 3B shows a schematic perspective illustration of the second exemplary embodiment of an illumination device described here. In this exemplary embodiment, a plurality of light modules 1 as described in conjunction with FIG. 3A are applied to a carrier 6 of the illumination device. That is to say that a plurality of folded light modules 1 are arranged onto a common carrier 6 of the illumination device. The light modules 1 and the control devices 4 of the light modules 1 are then fixed in the manner described in conjunction with FIGS. 2A and 2B.

Figure 4A:
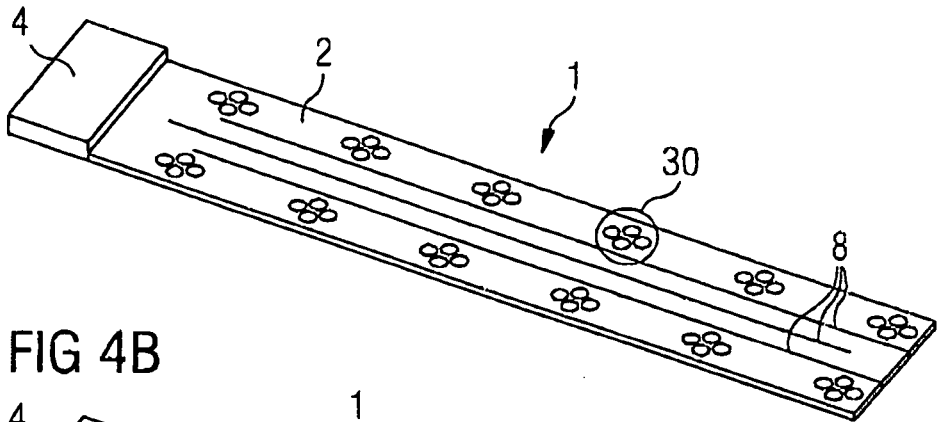
FIG. 4A shows a schematic perspective illustration of a light module 1 for a third exemplary embodiment of an illumination device described here.

FIG. 4A shows a schematic perspective illustration of a light module 1 for a third exemplary embodiment of an illumination device described here.

In this exemplary embodiment, the circuit board 2 of the light module 1 has a plurality of incisions 8. The incisions 8 extend over at least 70% of the length of the light module 1. In this case, the incisions 8 are embodied in such a way that they do not completely sever the circuit board 2. The incisions 8 can be produced for example by cutting or scribing.

Figure 4B:
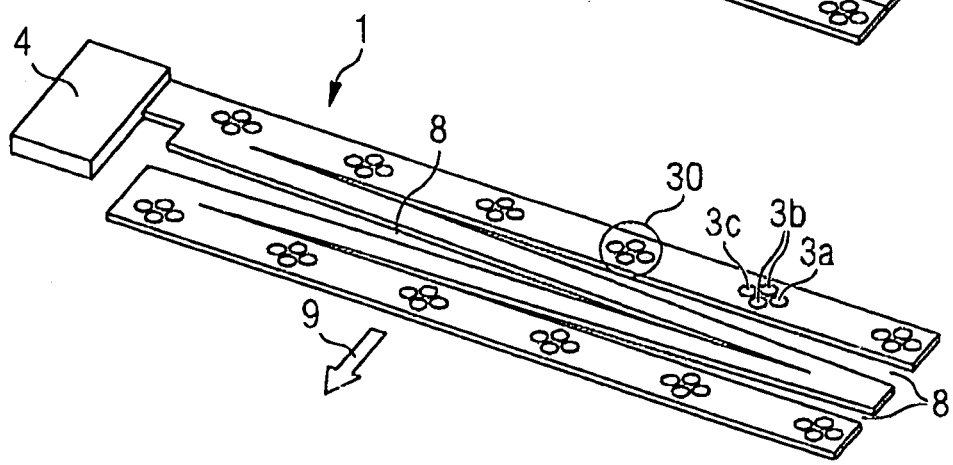
FIG. 4B shows a schematic perspective illustration of a light module 1 for the third exemplary embodiment of an illumination device described here.

As shown in the schematic perspective illustration of FIG. 4B, the light module 1 is pulled apart in the direction of the arrow 9. In this case, the direction runs transversely—that is to say perpendicular for example—with respect to the incisions 8. The light module 1 is then expanded in a direction running transversely with respect to the incisions 8. The distance between two lines of groups 30 of light emitting diodes 3a, 3b, 3c of the light module 1 is thereby increased. A light module 1 as shown in FIG. 4B permits a particularly cost-saving utilization of the carrier substrate, that is to say of the flexible circuit board 2. Preferably after the expansion of the light module 1, heat conducting elements 5 can be applied to the rear side of the light module 1.

Figure 4C:
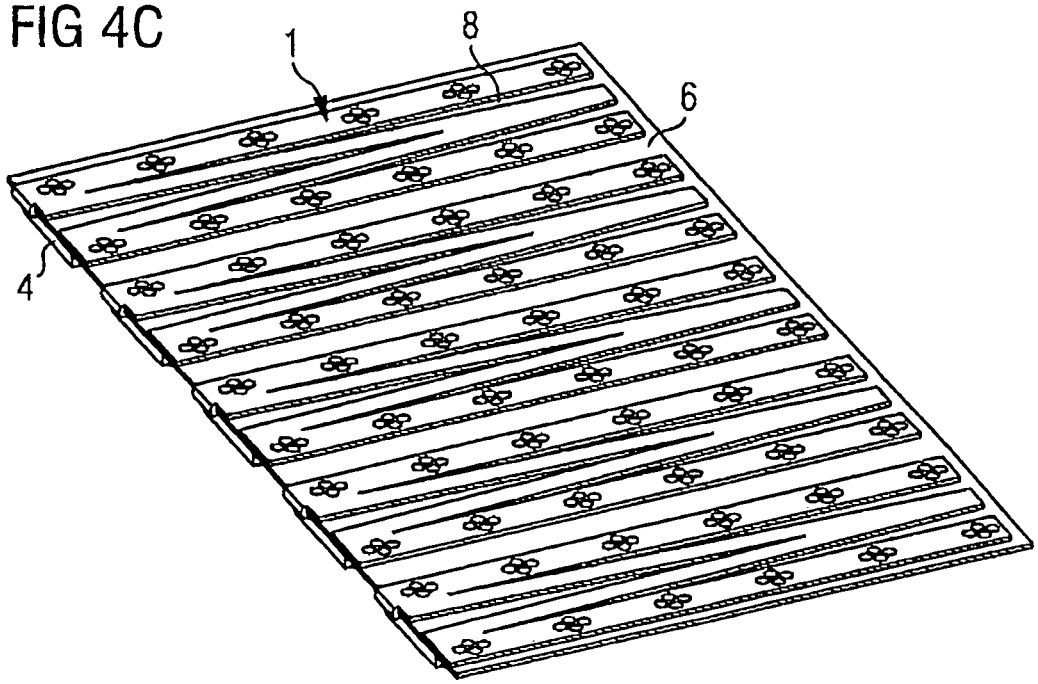
FIG. 4C shows a schematic perspective illustration of an illumination device described here in accordance with the third exemplary embodiment.

FIG. 4C shows a schematic perspective illustration of an illumination device described here in accordance with the third exemplary embodiment. In this case, a plurality of the expanded light modules 1 described in conjunction with FIG. 4B are applied to a carrier 6 of the illumination device.

Figure 5A:
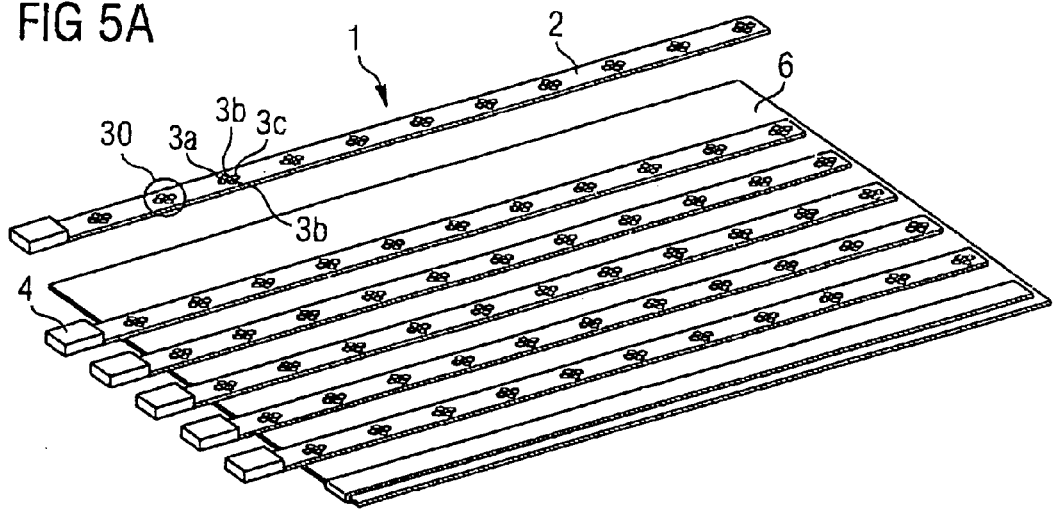
FIG. 5A schematically shows a perspective plan view of the illumination device in accordance with a fourth exemplary embodiment.
Figure 5B:
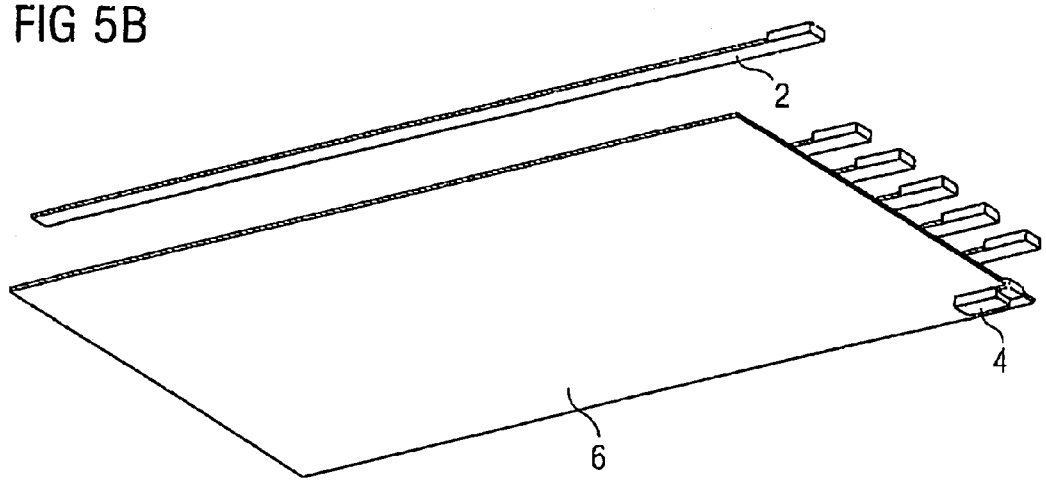
FIG. 5B schematically shows a perspective rear view of the illumination device in accordance with the fourth exemplary embodiment.

A fourth exemplary embodiment of an illumination device described here is described on the basis of schematic perspective illustrations in conjunction with FIGS. 5A and 5B.

FIG. 5A schematically shows a perspective plan view of the illumination device. FIG. 5B schematically shows a perspective rear view of the illumination device.

In the exemplary embodiment of the illumination device described in conjunction with FIGS. 5A and 5B, a heat conducting element 5 as shown in FIG. 1B, for example, is dispensed with. That is to say that the flexible circuit board 2 is applied directly to the carrier 6 of the illumination device. In this case, the flexible circuit board 2 can be formed for example in the manner of an adhesive tape. The flexible circuit board 2 then has a self-adhesive coating on its rear side, which coating can be covered by a protective film, for example. After the protective film has been stripped away, the light module 1 can be adhesively bonded onto the carrier 6. However, it is also possible for an adhesive to be applied to the rear side of the circuit board 2 and for the light module 1 to be connected to the carrier 6 by means of said adhesive.

In addition to the particularly simple and flexible processing, a flexible circuit board 2 also affords the following advantage. Since the flexible circuit board 2 is relatively thin and has a low thermal conductivity compared with a metal-core circuit board, for example, component soldering from the rear side of the flexible circuit board 2 is possible. The light emitting diodes 3a, 3b, 3c can thus be soldered from the rear side of the flexible circuit board. In this case, the circuit board is heated at points on the rear side. On account of the relatively low thermal conductivity of the flexible circuit board, the heat hardly propagates in a lateral direction, but rather melts soldering points which are present on the opposite side of the heating points and by means of which the light emitting diodes 3a, 3b and 3c are fixed on the circuit board 2 and electrically contact-connected.

This component soldering from the rear side of the flexible circuit board 2 enables, in particular, mounting of the light emitting diodes 3a, 3b, 3c with temperature-sensitive optical element 20 (see below) already mounted thereon.

FIG. 6 shows a schematic sectional illustration of a light emitting diode 3a such as is used in a light module 1 of the illumination device.

The light emitting diode 3a comprises a light emitting diode chip 300. The light emitting diode 3a furthermore comprises an optical element 20.

A radiation exit area 21 of the optical element 20 has a concavely curved partial region 50. The optical axis 60 of the optical element 20 runs through the concavely curved partial region 50. Furthermore, the optical element 20 has a convexly curved partial region 70, which surrounds the concavely curved partial region 50 at a distance from the optical axis 60. The convexly curved partial region 70 can be embodied in accordance with a convex lens. The concavely curved partial region 50 can be embodied in accordance with a concave lens.

Electromagnetic radiation generated in an active zone 303 of the light emitting diode chip 300 enters into the optical element 20 via a radiation entrance area 80, which is preferably embodied in planar fashion. The radiation generated by the light emitting diode chip 300, in particular visible radiation—that is to say light—is illustrated in FIG. 6 by the lines identified by arrows, which symbolize individual light rays.

The optical element 20 is formed for homogeneously illuminating an area 90, for instance a diffuser film or the imaging unit of a display apparatus such as an LCD panel. The optical axis 60 of the optical element 20 preferably runs through the area 90. In this case, the area 90 runs preferably perpendicular or substantially perpendicular to the optical axis 60.

The optical axis 60 runs through the light emitting diode chip 300. The light emitting diode chip 300 is preferably centered with respect to the optical axis 60. In this case, the optical axis 60 is perpendicular to the active zone 303 of the light emitting diode chip 300. The light emitting diode chip 300 is preferably a thin-film light emitting diode chip as described further above, comprising a carrier 301 and a preferably epitaxially produced semiconductor body 302 comprising the active zone 303. The growth substrate for the semiconductor body 302 has been removed in this case. The carrier 301 is accordingly different from the growth substrate and does not have to meet the stringent requirements made of a growth substrate, but rather can be chosen comparatively freely with regard to further properties that are advantageous for the light emitting diode chip 300, such as a high thermal conductivity, for instance.

FIG. 7 shows a schematic perspective illustration of a portion from a light module 1 such as can be used in one of the exemplary embodiments of the illumination device described further above. In this case, a group of light emitting diodes 3a, 3b and 3c is illustrated in greater detail by way of example in FIG. 7. The group 30 comprises two green light emitting diodes 3b, one red light emitting diode 3c and one blue light emitting diode 3a. The light emitting diodes 3a, 3b, 3c each comprise an optical element 20 as described in conjunction with FIG. 6. The optical element 20 has a concavely curved partial region 50 around which a convexly curved partial region 70 runs completely. In this case, the optical element 20 is formed rotationally symmetrically with respect to the optical axis 60. The optical element 20 is suitable for shaping the emission characteristic of the light emitting diode in such a way that the light emitting diode illuminates particularly homogeneously an area 90 at a distance from it.

The light emitting diodes 3a, 3b, 3c are electrically contact-connected to the circuit board 2 by means of two contact locations 10, 11 in each case.

The light emitting diodes 3a, 3b, 3c of the group 30 are arranged on grid points S1 of a regular grid S. The grid points S1 preferably coincide with the piercing points of the optical axis 60 through the radiation exit area 21 of the optical element 20 of each light emitting diode. On account of the rotational symmetry of the light emitting diodes 3a, 3b, 3c, the grid points S furthermore coincide with the geometrical centroids of the optical elements 20. The distance between individual light emitting diodes 3a, 3b, 3c of a group 30 is preferably between 10 and 20 mm. The distance between two adjacent groups 30 of light emitting diodes 3a, 3b, 3c is preferably between 30 and 100 mm.

The illumination devices described here are distinguished by the following advantages, inter alia:

No plug connections are required for connecting the individual parts. This increases the system reliability and permits an extremely flat design of the illumination device since additional structural space for plugs is obviated.

The illumination device has a particularly high integration density since the flexible conductor tracks of the flexible circuit boards 2 enable in a very simple manner additional connecting paths via which the light emitting diodes 3a, 3b, 3c can be supplied with current, for example. Furthermore, it is possible to provide conductor tracks for optical and thermal sensors 40, which can be integrated for example into each of the light modules 1 and monitor the light sources 3a, 3b, 3c of the light module 1.

Furthermore, an exact assignment of driving and light source with individual adaptation possibilities—for example operation of the light source with optimum current, which can be set by means of calibration, and use of different light source groupings in a backlighting unit—is made possible.

Furthermore, an interaction between a plurality of light modules 1 is made possible for example by the connection of adjacent control devices 4.

In the case of failure of one or more light emitting diodes of a light module 1, the illumination device can be repaired simply by replacing the entire light module.

The arrangement of the control devices 4 on that side of the backplane 6 which is remote from the light emitting diodes 3a, 3b, 3c enables a particularly flat and space-saving design of the illumination device.

The invention is not restricted by the description on the basis of the exemplary embodiments, Rather, the invention encompasses any new feature and also any combination of features, in particular any combination of features in the patent claims, even if these features or this combination of features are/is themselves/itself not explicitly specified in the patent claims or exemplary embodiments.

The invention claimed is:
1. An illumination device comprising:
at least one light module having a plurality of groups of light sources, wherein the light module comprises a common flexible circuit board to which the plurality of groups of light sources are applied, and
a common carrier on which the light module is fixed, such that the groups of light sources are arranged in lines on the common carrier, at least two of said lines being arranged at a distance, wherein the distance is set by one of:
- a U-shaped bend of the common flexible circuit board, said bend being formed by two successive folds of the common flexible circuit board, and
- an expansion of the common flexible circuit board in a direction running transversely with respect to a plurality of incisions of the common flexible circuit board, at least one of said incisions running between the at least two lines of the groups of light sources.

2. The illumination device as claimed in claim 1,
wherein at least one of the light sources comprises a light emitting diode.

3. The illumination device as claimed in claim 2, wherein the light emitting diode comprises a light emitting diode chip provided for generating radiation and an optical element which has an optical axis,
wherein the optical element has a radiation exit area, and
wherein the radiation exit area has a concavely curved partial region and a convexly curved partial region, which at least partly surrounds the concavely curved partial region at a distance from the optical axis, wherein the optical axis runs through the concavely curved partial region.

4. The illumination device as claimed in claim 3,
wherein the light emitting diode chip is formed by a thin-film light emitting diode chip.

5. The illumination device as claimed in claim 1,
wherein the incision extends along at least 70% of a length of the common flexible circuit board of the light module.

6. The illumination device as claimed in claim 1,
wherein the light module is expanded in a direction running transversely with respect to the incision.

7. The illumination device as claimed in claim 1,
wherein a heat conducting element is applied to that side of the common flexible circuit board of the light module which is remote from the light sources.

8. The illumination device as claimed in claim 1,
wherein a plurality of light modules are arranged in lines on the common carrier, and
wherein the lines of the groups of light sources are parallel to one another.

9. The illumination device as claimed in claim 1,
wherein at least one light module comprises a control device, which is suitable for controlling an operating current through the light sources.

10. The illumination device as claimed in claim 9,
wherein the control device is adapted for regulating an operating current through the light sources depending on measured values determined by a sensor.

11. The illumination device as claimed in claim 9,
wherein the control device is arranged on that side of the common carrier which is remote from the light sources.

12. The illumination device according to claim 1, wherein the common flexible circuit board has the plurality of incisions, the plurality of incisions being made in the common flexible circuit board from alternate edges of the common flexible circuit board.

13. The illumination device as claimed in claim 1, wherein the common flexible circuit board includes a flexible basic body comprising a flexible, electrically insulating material, wherein electrical conductor tracks are structured on the electrically insulating basic body.

14. A display apparatus comprising:
an imaging unit; and
a backlighting device for the imaging unit, which is formed by an illumination device as claimed in claim 1.

15. The display apparatus as claimed claim 14,
wherein the imaging unit comprises an LCD panel and the LCD panel is arranged parallel to the common flexible circuit board of at least one of the light modules.

16. An illumination device comprising:
a plurality of light modules, wherein each of the light modules comprises:
  a circuit board to which a plurality of groups of light sources are applied; and
  a control device configured to control an operating current through the plurality of groups of light sources of the respective light module; and
a common carrier on which the plurality of light modules are fixed,
wherein the control device in each of said light modules is mechanically fixed on a side of the common carrier remote from the plurality of groups of light sources,
wherein the groups of light sources of each light module are arranged in lines on the common carrier, at least two of said lines being arranged at a distance,
wherein the distance is set by one of:
  a U-shaped bend of the circuit board, said bend being formed by two successive folds of the circuit board, and
  an expansion of the circuit board in a direction running transversely with respect to a plurality of incisions, wherein at least one of said incisions runs between the at least two lines of groups of light sources.

17. The illumination device according to claim 16, wherein each control device is assigned to a respective light module and the control devices of individual ones of the light modules are electrically interconnected.

* * * * *